(12) United States Patent
Shimazawa et al.

(10) Patent No.: US 7,885,042 B2
(45) Date of Patent: Feb. 8, 2011

(54) CPP MAGNETO-RESISTIVE EFFECT DEVICE UTILIZING AN ANTI-OXIDIZING LAYER AS PART OF THE SPACER LAYER IN A THIN-FILM MAGNETIC HEAD USABLE IN A HEAD GIMBAL ASSEMBLY IN A HARD DISK SYSTEM

(75) Inventors: Koji Shimazawa, Tokyo (JP); Yoshihiro Tsuchiya, Tokyo (JP); Tomohito Mizuno, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 715 days.

(21) Appl. No.: 11/870,097

(22) Filed: Oct. 10, 2007

(65) Prior Publication Data
US 2008/0100968 A1    May 1, 2008

(30) Foreign Application Priority Data
Oct. 31, 2006    (JP) .............................. 2006-295237

(51) Int. Cl.
*G11B 5/39* (2006.01)
(52) U.S. Cl. ............... 360/324.2; 29/603.14; 29/603.16
(58) Field of Classification Search ...... 360/324–324.2; 365/145, 158, 171–173; 257/421–427; 428/810–816; 29/603.7–603.18
See application file for complete search history.

(56) References Cited

U.S. PATENT DOCUMENTS

| | | | | |
|---|---|---|---|---|
| 6,480,412 B1 * | 11/2002 | Bessho et al. | ............... | 365/173 |
| 6,617,658 B2 * | 9/2003 | Kajiyama | ................... | 257/421 |
| 7,057,258 B2 * | 6/2006 | Tran et al. | ................... | 257/530 |
| 2006/0067017 A1 | 3/2006 | Yuasa et al. | | |
| 2008/0019060 A1 | 1/2008 | Mizuno et al. | | |

FOREIGN PATENT DOCUMENTS

JP    2003-8102    1/2003

OTHER PUBLICATIONS

U.S. Appl. No. 11/968,911, filed Jan. 3, 2008, Tsuchiya et al.

(Continued)

*Primary Examiner*—A. J. Heinz
(74) *Attorney, Agent, or Firm*—Oblon, Spivak, McClelland, Maier & Neustadt, L.L.P.

(57) ABSTRACT

A giant magneto-resistive effect device having a CPP structure comprising a spacer layer, and a fixed magnetization layer and a free layer stacked one upon another with the spacer layer interposed between them, with a sense current applied in a stacking direction. The spacer layer comprises a first nonmagnetic metal layer and a second nonmagnetic metal layer, each made of a nonmagnetic metal material, and a semiconductor layer formed between the first and the second nonmagnetic metal layer. The semiconductor layer is an n-type oxide semiconductor. When the first and second nonmagnetic metal layers are formed in order, the first nonmagnetic metal layer is formed prior to the second nonmagnetic metal layer, and an anti-oxidizing layer is formed between the first nonmagnetic metal layer and the semiconductor layer. The anti-oxidizing layer is formed of a material incapable of producing a Schottky barrier upon joining to the semiconductor layer.

12 Claims, 11 Drawing Sheets

OTHER PUBLICATIONS

U.S. Appl. No. 12/112,598, filed Apr. 30, 2008, Hara et al.
U.S. Appl. No. 11/934,979, filed Nov. 5, 2007, Mizuno et al.
U.S. Appl. No. 12/128,352, filed May 28, 2008, Mizuno et al.
U.S. Appl. No. 11/626,562, filed Jan. 24, 2007, Hara et al.
U.S. Appl. No. 11/757,174, filed Jun. 1, 2007, Tsuchiya et al.
U.S. Appl. No. 11/865,384, filed Oct. 1, 2007, Hara et al.
U.S. Appl. No. 11/931,219, filed Oct. 31, 2007, Shimazawa et al.

* cited by examiner

CPP MAGNETO-RESISTIVE EFFECT DEVICE UTILIZING AN ANTI-OXIDIZING LAYER AS PART OF THE SPACER LAYER IN A THIN-FILM MAGNETIC HEAD USABLE IN A HEAD GIMBAL ASSEMBLY IN A HARD DISK SYSTEM

BACKGROUND OF THE INVENTION

1. Field of the Invention

The present invention relates to a magneto-resistive effect device for reading the magnetic field strength of a magnetic recording medium or the like as signals, a thin-film magnetic head comprising that magneto-resistive effective device, and a head gimbal assembly and a magnetic disk system comprising that thin-film magnetic head.

2. Explanation of the Prior Art

With recent improvements in the plane recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinned layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinned layer (antiferromagnetic layer).

Incidentally, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-GMR device), too, are now under development as next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetized layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

It is here noted that when the TMR device is used for a reproducing head, it is required to have low resistance for the following reasons. For a magnetic disk system, there is a demand for improved recording density and improved data transfer rate, with which the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must inevitably have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise, a drop of MR ratio, and degradation of TMR device's performance. The noise occurring at the reproducing head is here called head noise. The head noise occurring at the reproducing head using the TMR device includes shot noise, a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A possible reason for it could be that spin-polarized electrons are scattered at the interface between the nonmagnetic electroconductive layer and the magnetic layer, and in the nonmagnetic electroconductive layer.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in a direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to a current density. As the voltage applied to the CPP-GMR device grows high, it causes the current density to grow large with the result that there is large spin torque. As the spin torque increases, there are problems such as changes in the direction of magnetization of the fixed magnetization layer, and the inability of the free layer to freely change the direction of magnetization with respect to an external magnetic field.

To solve such problems, Applicant has already filed Japanese Patent Application No. 2006-275972 to come up with an invention relating to a CPP-GMR device, with which large MR ratios are achieved while noise is held back and the influence of the spin torque is reduced.

That is to say, in a preferable embodiment of that invention, a spacer layer interposed between the free layer and the fixed magnetized layer has typically a Cu/ZnO/Cu multilayer structure, and the area resistivity (AR) of a magneto-resistive effect device and the electro-conductivity of the spacer layer are determined in such a way as to fall within the given ranges.

By allowing the spacer layer to have typically a three-layer structure of Cu/ZnO/Cu according to this proposal, large MR ratios are achievable while holding back noise and reducing the influence of the spin torque.

The present invention is an invention for making improvements in or relating to Japanese Patent Application No. 2006-275972, and embodied as follows.

That is to say, the inventors' experimentation has revealed that when the invention proposed in Japanese Patent Application No. 2006-275972 is carried out under ordinary process conditions, the ZnO layer that is a semiconductor layer is often deficient in oxygen, and such an oxygen-deficient state varies in a wafer. This variation of the oxygen-deficient state may otherwise be a leading reason for giving rise to variations in the resistance value and MR change ratio of each device.

The inventors have had hit upon an idea that the oxygen deficiency or the variation of oxygen deficiency may possibly cleared by the intentional oxidization of the surface of the ZnO layer, trying experimentation.

However, the results of actual experimentation for oxidization have taught that severe process control is needed for the oxidization of the surface of the ZnO layer, and as the fabrication conditions fluctuate even a little, it may incur the risk of oxidizing the Cu layer below it or the magnetic layer below it. And such an excessive oxidizing state would possibly offer a problem: device's performance deterioration, viz., a drop of the MR ratio of the GMR device.

The situation being like this, it is much desired to have a novel spacer layer structure that can stave off any oxygen deficiency in a wafer to get rid of oxygen deficiency variations without producing adverse influences on device's performance, and can prevent oxidization of a layer that lies below a semiconductor layer or, in other words, a new spacer layer structure that makes sure high MR performance without increasing the head noise and can hold back variations of a device's area resistivity (AR), thereby making much more improvements in the reliability of film performance.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interleaved between the fixed magnetization layer and the free magnetization layer, and a resistance control layer interleaved between the fixed magnetization layer and the free magnetization layer and formed of a material having conduction carriers of up to $10^{22}/cm^3$. The prior art shows a semiconductor as one of resistance control layer materials; however, it does not suggest at al about the requirements for the invention of this application.

SUMMARY OF THE INVENTION

To provide a solution to such problems as described above, the present invention provides a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that the direction of magnetization changes depending on an external magnetic field, and said spacer layer comprises a first nonmagnetic metal layer and a second nonmagnetic metal layer, each made of a nonmagnetic metal material, and a semiconductor layer formed between said first nonmagnetic metal layer and said second nonmagnetic metal layer, wherein said semiconductor layer is an n-type oxide semiconductor; when said first and second nonmagnetic metal layers are formed in order, said first nonmagnetic metal layer is formed prior to said second nonmagnetic metal layer; and an anti-oxidizing layer is formed between said first non-magnetic metal layer and said semiconductor layer, wherein said anti-oxidizing layer is formed of a material incapable of producing a Schottky barrier upon joining to said semiconductor layer.

In one preferable embodiment of the invention, said anti-oxidizing layer is made of a material of which the value of a work function is smaller than that of a material of which said first nonmagnetic metal layer is made.

In another preferable embodiment of the invention, said first nonmagnetic metal layer is made of Cu, and said anti-oxidizing layer is made of at least one selected from the group consisting of Ru, In, alloys composed mainly of Ru, and alloys composed mainly of In.

In yet another preferable embodiment of the invention, said first nonmagnetic metal layer and said second nonmagnetic metal layer are each made of Cu, said semiconductor layer is made of ZnO, and said anti-oxidizing layer is made of at least one selected from the group consisting of Ru, In, alloys composed mainly of Ru, and alloys composed mainly of In.

In a further preferable embodiment of the invention, said anti-oxidizing layer has a thickness of 0.5 nm to 1.5 nm.

In a further preferable embodiment of the invention, the magneto-resistive effect device has an area resistivity of 0.1 to 0.3 $\Omega \cdot \mu m^2$.

The invention also provides a process for fabricating the aforesaid magneto-resistive effect device, wherein when said spacer layer is formed, the first non-magnetic metal layer, anti-oxidizing layer and semiconductor layer are formed by sputtering in order into a triple-layer structure, and the surface of the semiconductor layer is then oxidized, after which the second nonmagnetic metal layer is formed by sputtering.

Further, the invention provides a process for fabricating the aforesaid magneto-resistive effect device, wherein when said spacer layer is formed, the first non-magnetic metal layer comprising Cu, anti-oxidizing layer and semiconductor layer comprising ZnO are formed by sputtering in order into a triple-layer structure, and the surface of the ZnO semiconductor layer is then oxidized, after which the second nonmagnetic metal layer comprising Cu is formed by sputtering.

In one preferable embodiment of the process for fabricating the magneto-resistive effect device according to invention, the surface of said semiconductor layer is oxidized, and then heat treated in a vacuum, after which the second nonmagnetic metal layer is formed by sputtering.

Further, the invention provides a thin-film magnetic head, which comprises a plane opposite to a recoding medium, the aforesaid magneto-resistive effect device, which is located near said medium opposite plane for detecting a signal magnetic field from said recording medium, and a pair of electrodes for passing a current in the stacking direction of said magneto-resistive effect device.

Further, the invention provides a head gimbal assembly, which comprises a slider including the aforesaid thin-film magnetic head and located in opposition to a recording medium, and a suspension adapted to resiliently support said slider.

Further, the invention provides a hard disk system, which comprises a slider including the aforesaid thin-film magnetic head and located in opposition to a recording medium, and a positioning means adapted to support and position said slider with respect to said recording medium.

The invention provides a giant magneto-resistive effect device (CPP-GMR device) having a CPP (current perpendicular to plane) structure comprising a spacer layer, and a fixed magnetization layer and a free layer stacked one upon another with the spacer layer interposed between them, with a sense current applied in a stacking direction. The free layer functions such that the direction of magnetization changes depending on an external magnetic field. The spacer layer comprises a first nonmagnetic metal layer and a second nonmagnetic metal layer, each made of a nonmagnetic metal material, and a semiconductor layer formed between the first and the second nonmagnetic metal layer. The semiconductor layer is an n-type oxide semiconductor. When the first and second nonmagnetic metal layers are formed in order, the first nonmagnetic metal layer is formed prior to the second nonmagnetic metal layer, and an anti-oxidizing layer is formed between the first and the semiconductor layer. The anti-oxidizing layer is formed of a material incapable of producing a Schottky barrier upon joining to the semiconductor layer. It is thus possible to achieve very favorable advantages of obtaining high MR performance without increasing the head noise, and holding back variations of device's area resistivity (AR), thereby making much more improvements in the reliability of film characteristics.

DETAILED EXPLANATION OF THE INVENTION

The best mode for carrying out the invention is now explained in details.

Figure 1:
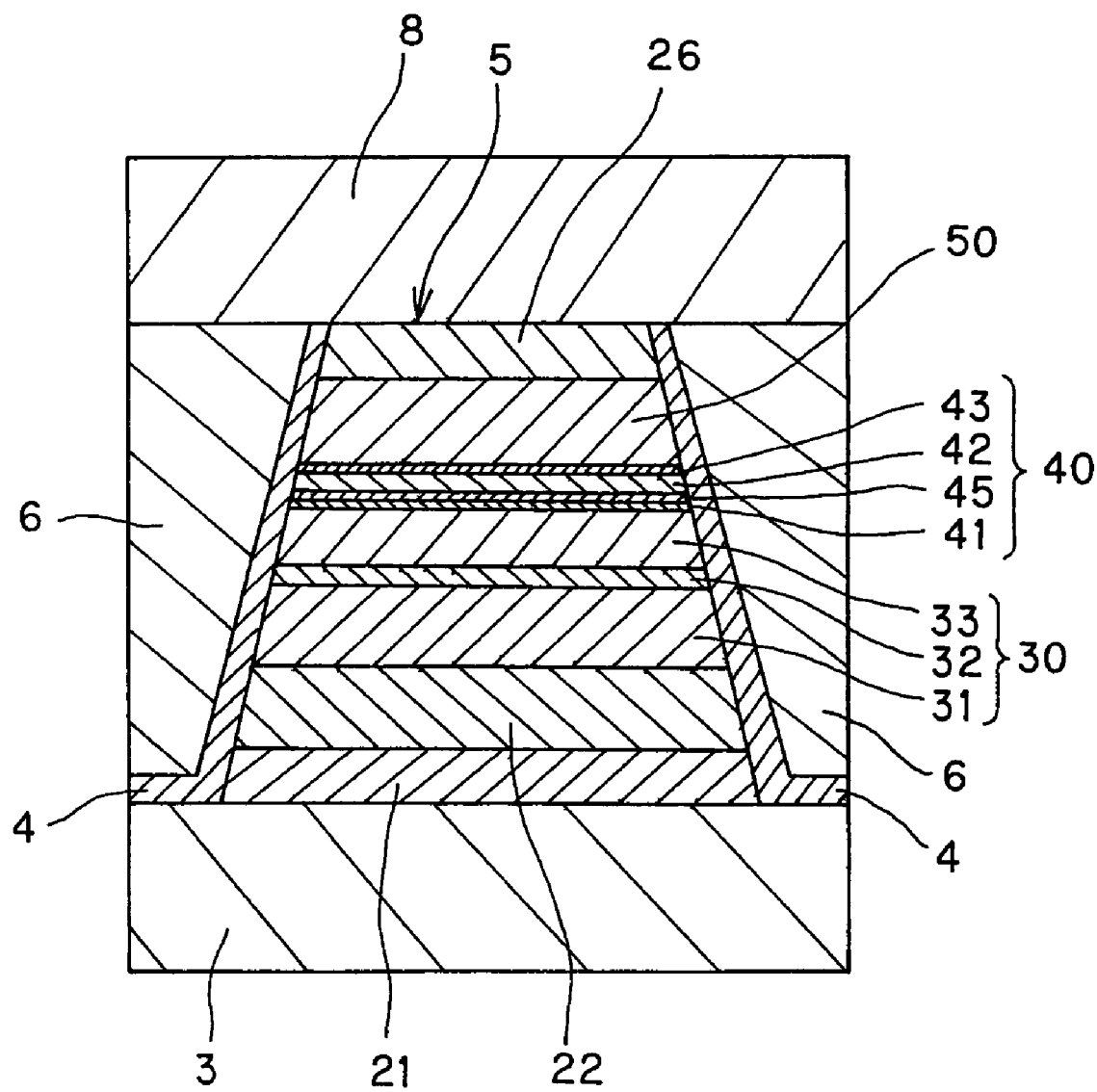
FIG. 1 is a sectional view illustrative of a section of the reproducing head in the embodiment of the invention, which is substantially parallel with the medium opposite plane.

FIG. 1 is illustrative of the ABS (air bearing surface) of the reproducing head in an embodiment of the invention; FIG. 1 is illustrative in schematic of the ABS of the giant magneto-resistive effect device of the CPP structure (CPP-GMR device)—part of the invention. The "ABS" is generally corresponding to a plane (hereinafter often called the medium opposite plane) at which a reproducing head is in opposition to a recording medium; however, it is understood that the "ABS" here includes even a section at a position where the multilayer structure of the device can be clearly observed. For instance, a protective layer such as DLC or the like (the protective layer adapted to cover the device), in a strict sense, positioned facing the medium opposite plane may be factored out, if necessary.

Figure 2:
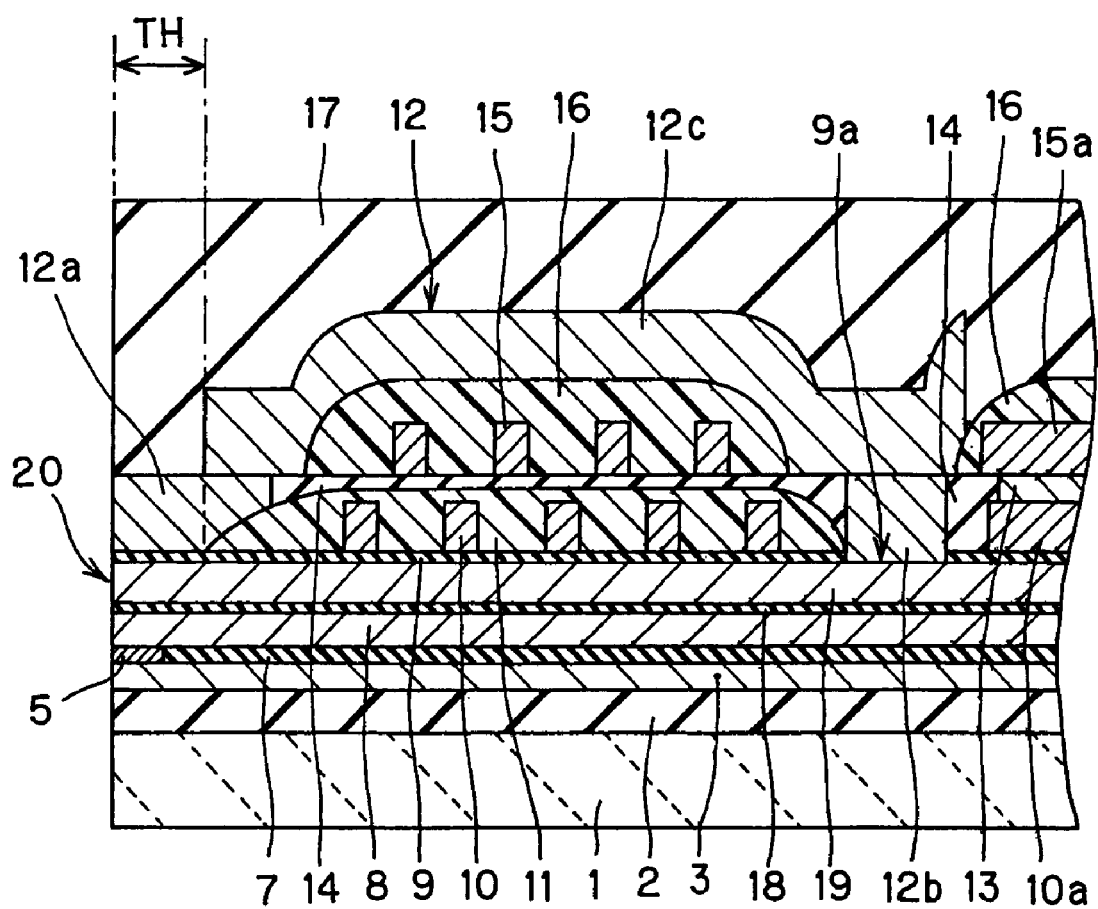
FIG. 2 is illustrative of the construction of the thin-film magnetic head according to one preferable embodiment of the invention; it is a sectional view illustrative of a section of the thin-film magnetic head perpendicular to the medium opposite plate and the substrate.

FIG. 2 is illustrative of the construction of a thin-film magnetic head according to one preferable embodiment of the invention or it is a sectional view illustrative of the thin-film magnetic head perpendicular to the ABS and substrate.

Figure 3:
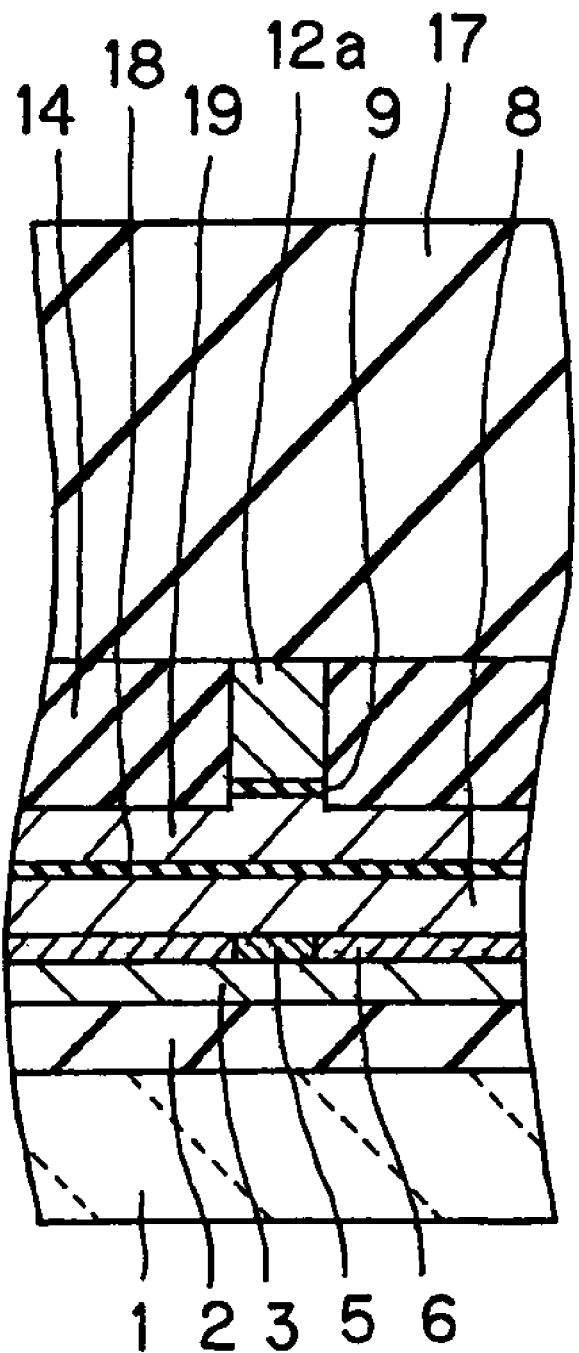
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.

FIG. 3 is illustrative of the construction of the thin-film magnetic head according to one preferable embodiment of the invention or it is a sectional view illustrative of a section of a magnetic pole portion of the thin-film magnetic head parallel with the ABS.

Figure 4:
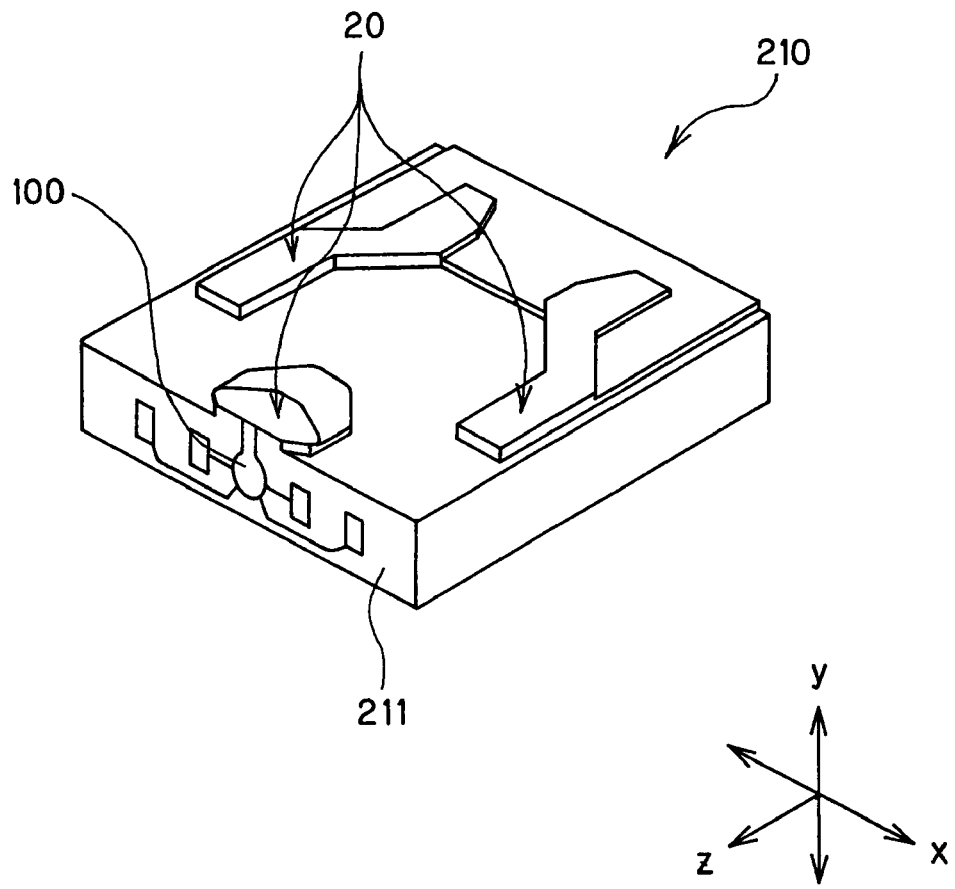
FIG. 4 is a perspective view of a slider built in the head gimbal assembly according to one embodiment of the invention.
Figure 5:
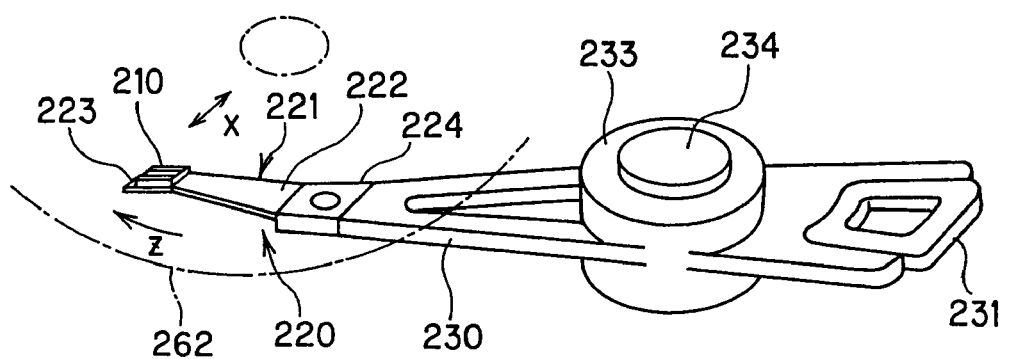
FIG. 5 is a perspective view of a head arm assembly including the head gimbal assembly according to one embodiment of the invention.
Figure 6:
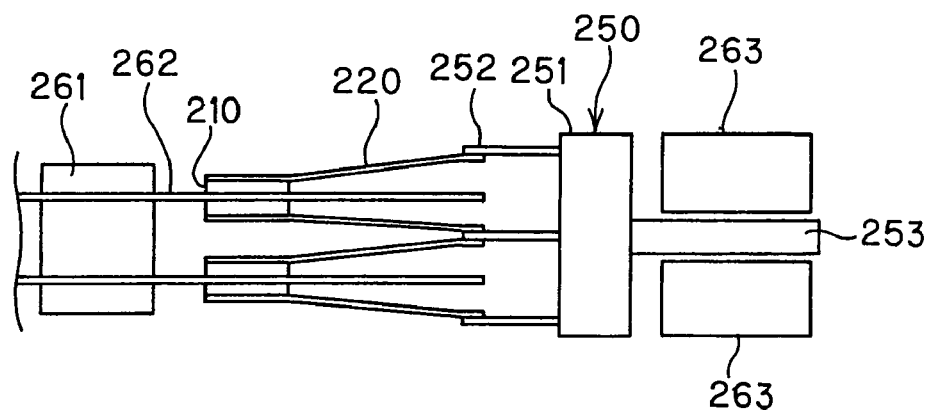
FIG. 6 is illustrative of part of the hard disk system according to one embodiment of the invention.
Figure 7:
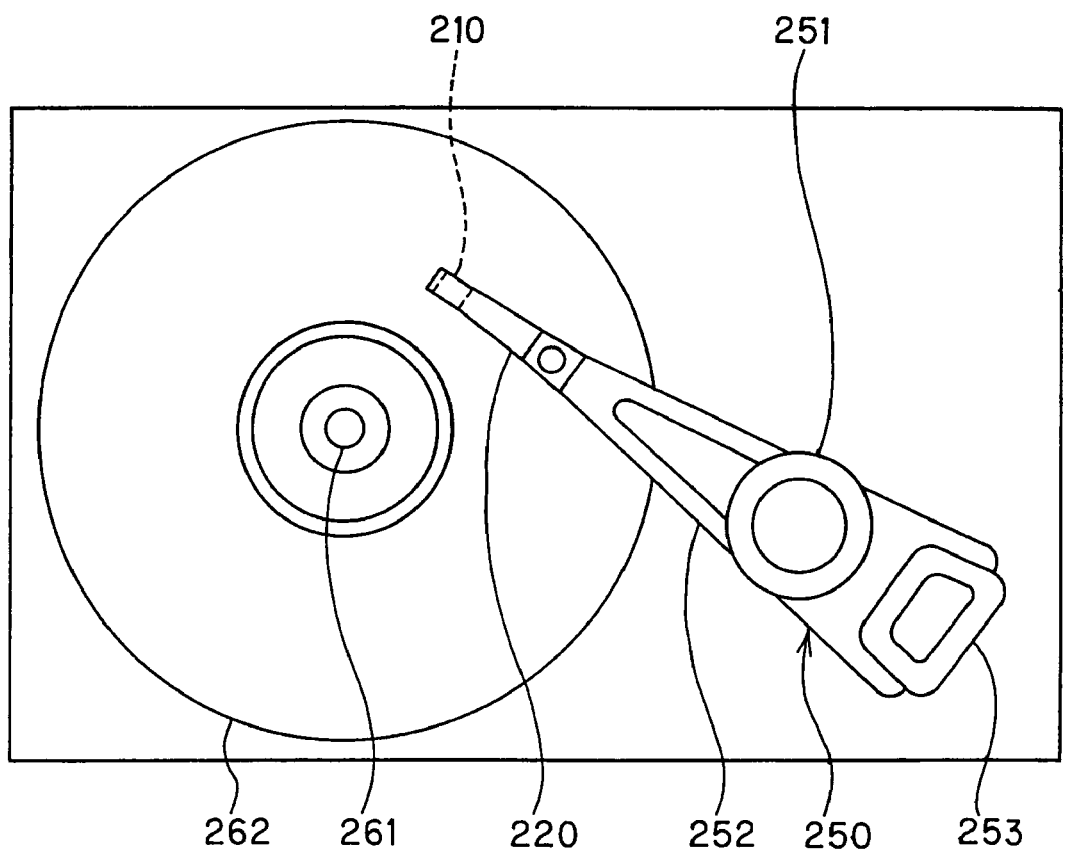
FIG. 7 is a plan view of the hard disk system according to one embodiment of the invention.

FIG. 4 is a perspective view of a slider built in the head gimbal assembly according to one embodiment of the invention;

FIG. 5 is a perspective view of a head arm assembly including the head gimbal assembly according to one embodiment of the invention; FIG. 6 is illustrative of part of the hard disk system according to one embodiment of the invention; and FIG. 7 is a plan view of the hard disk system according to one embodiment of the invention.

[Giant Magneto-Resistive Effect Device of the CPP Structure (CPP-GMR Device]

The construction of the reproducing head comprising the inventive giant magneto-resistive effect device of the CPP structure (CPP-GMR device) is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are vertically opposed to each other at a given space, a giant magneto-resistive effect device 5 (hereinafter referred simply to as the GMR device 5) disposed between the first shield layer 3 and the second shield layer 8, an insulating film 4 adapted to cover two sides of the GMR device 5 and a part of the upper surface of the first shield layer 3 along these sides, and two bias magnetic field-applying layers 6 adjacent to the two sides of the GMR device 5 via the insulating layer 4.

The first 3 and the second shield layer 8 take a so-called magnetic shield role plus a pair-of-electrodes role. In other words, they have not only a function of shielding magnetism but also function as a pair of electrodes adapted to pass a sense current through the GMR device in a direction intersecting the plane of each of the layers forming the GMR device 5, that is, in a direction perpendicular to the plane of each of the layers forming the GMR device (stacking direction).

It is acceptable that besides the first shield layer 3 and the second shield layer 8, the GMR device is vertically provided with another pair of electrodes.

The reproducing head of the invention comprises the GMR device 5 of the CPP structure—part of the invention.

In terms of an easy-to-understand, broad conception, the GMR device 5 of the CPP structure according to the invention comprises a spacer layer 40, and a fixed magnetization layer 30 and a free layer 50 that are stacked one upon another with the spacer layer 40 held between them, as shown in FIG. 1. And then, a sense current is applied to the GMR device 5 in its stacking direction to enable its function. In short, there is the GMR device 5 of the CPP (current perpendicular to plane) structure involved.

The free layer 50 has its magnetization direction changing dependent on an external magnetic field, viz., a signal magnetic field from a recording medium, while the fixed magnetization layer 30 has its magnetization direction remaining fixed under the action of an anti-ferromagnetic layer 22. Although FIG. 1 shows the embodiment wherein the antiferromagnetic layer 22 is formed on the bottom side (the side of the first shield layer 3), it is understood that the antiferromagnetic layer 22 may be located on the top side (the side of the second shield layer 8) to reverse the free layer 50 and fixed magnetization layer 30 in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, that fixed magnetization layer 30 has a so-called synthetic pinned layer comprising, in order from the side of the antiferromagnetic layer 22, an outer layer 31, a nonmagnetic intermediate layer 32 and an inner layer 33, all stacked together in order.

The outer layer 31 and the inner layer 33 are each made of a ferromagnetic layer comprising a ferromagnetic material such as Co or Fe. The outer layer 31 and the inner layer 33 are antiferromagnetically coupled and fixed such that their magnetization directions are opposite to each other.

The outer layer 31 and the inner layer 33 are preferably each made of an alloy layer such as $Co_{70}Fe_{30}$ (atomic %). The outer layer has a thickness of preferably about 3 to 7 nm, and the inner layer 33 has a thickness of preferably about 3 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of typically about 0.35 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has the direction of magnetization changing depending on an external magnetic field, viz., a signal magnetic field from the recording medium, and is made of a ferromagnetic layer (soft magnetic layer) having a decreased coercive force. The free layer 50 has a thickness of typically about 2 to 10 nm. The free layer 50 may be made of a single layer alone or, alternatively, it may be of a multilayer structure having multiple ferromagnetic layers. In addition, the free layer 50 may also contain a Heusler alloy layer.

On such free layer 50, as shown in FIG. 15, there is a protective layer 26 formed, which comprises a Ta or Ru layer as an example. The protective layer 26 has a thickness of about 0.5 to 20 nm.

(Explanation of the Spacer Layer 40)

In the embodiment shown in FIG. 1, the spacer layer 40 according to the invention comprises a first nonmagnetic metal layer 41, a second nonmagnetic metal layer 43 and a semiconductor layer 42 formed between the first 41 and the second nonmagnetic metal layer 43.

The first nonmagnetic metal layer 41 is a film layer that is to be formed prior to the formation of the second non-magnetic metal layer 43. In the invention, the anti-oxidizing layer 45 is formed between the first nonmagnetic metal layer 41 and the semiconductor layer 42 as if it were inserted between them.

The anti-oxidizing layer 45 must be formed of a material that is unlikely to produce a Schottky barrier upon joining to the semiconductor layer 42, especially at a joining interface. The presence of the Schottky barrier at the interface between the semiconductor layer 42 that is a semiconductor and the first nonmagnetic metal layer 41 that is a metal offers a problem that the head noise increases.

To stave off the Schottky barrier, the anti-oxidizing layer 45 is constructed of a material of which the value of work function is smaller than that of the material of which the first nonmagnetic metal layer 41 is constructed.

The "work function" here is defined as the minimum energy taken for moving one electron from the surface of a metal or semiconductor crystal to just outside that surface.

[Specific Arrangement of the Spacer Layer 40 in the Invention]

The specific arrangement of the spacer layer 40 in the invention is now explained in details.

(First Nonmagnetic Metal Layer 41 and Second Nonmagnetic Metal Layer 43)

The first 41 and the second nonmagnetic metal layer 43 are each composed of Cu at a thickness of 0.3 to 2.0 nm, preferably 0.5 to 1.0 nm. At less then 0.3 nm, the MR ratio drops. A possible reason for this could be that as the first and the second nonmagnetic metal layer become too thin, they do not grow continuously and take an island form where spin-polarized electrons are likely to scatter. At by far greater than 3.0 nm, the MR ratio drops again for the reason of noticeable scattering of spin-polarized electrons in the first and the second nonmagnetic metal layer.

One surface of such first 41, and second nonmagnetic metal layer 43 (in no contact with anti-oxidizing layer 45, and semiconductor layer 42, respectively) is in contact with the aforesaid fixed magnetization layer 30 and free layer 50, each a ferromagnetic layer. To create spin-polarized conduction electrons, however, the first 41 and the second nonmagnetic metal layer 43 must be each composed of Cu with none of impurities at the interface. In the embodiment shown in FIG. 1, the first nonmagnetic metal layer 41 is positioned on the side of the fixed magnetization layer 30 while the second nonmagnetic metal layer 43 is positioned on the side of the free layer 50.

In terms of film-formation order, the first nonmagnetic metal layer 41 here is defined as being formed prior to the formation of the second nonmagnetic metal layer 43. In the device morphology wherein the anti-ferromagnetic layer 22 is on the bottom side (the so-called antiferromagnetic layer bottom type) as shown in FIG. 1, the first nonmagnetic metal layer 41 is in contact with the fixed magnetization layer 30. In the device morphology wherein the antiferromagnetic layer 22 is on the top side (the so-called antiferromagnetic layer top type, although not shown), on the contrary, the first nonmagnetic metal layer 41 is in contact with the free layer.

(Semiconductor Layer 22)

The semiconductor layer 42 is in the form of an n-type semiconductor comprising one selected from oxide semiconductors, i.e., ZnO, TiO, $SnO_2$, $Ga_2O_3$ and InO, with ZnO being most preferred.

The semiconductor layer 42, when composed of ZnO, should have a thickness of about 1.2 to 2.0 nm.

(Anti-Oxidizing Layer 45)

Preferably, the anti-oxidizing layer 45 is formed of a material less likely to be oxidized; as already noted, however, the value of the work function of the material of which the anti-oxidizing layer 45 is made should be smaller than that of the material of which the first non-magnetic metal layer 41 is made.

From such a point of view, when the first nonmagnetic metal layer 41 is Cu, the anti-oxidizing layer 45 is made of at least one selected from the group consisting of Ru, In, alloys composed mainly of Ru, and alloys composed mainly of In. Such materials are preferable because of working for prevention of creation, for instance at the interface of the ZnO semiconductor, of the Schottky barrier over a wide margin even when there is an energy state change in association with a sensitive structural change of ZnO. For instance, a possible reason of why there is none of the Schottky barrier created on the Cu/ZnO interface could be that the work function of Cu is smaller than that of ZnO, and that the work function of Ru or In is approximate to, or smaller than, that of Cu. The effect of the anti-oxidizing layer of the invention has been ascertained, as can be seen from the results of experimentation given later. Note here that from the condition that there must be none of the Schottky barrier formed at the ZnO interface, Au or Pt usually used as an anti-oxidizing layer is factored out.

The alloys composed mainly of Ru, of which the anti-oxidizing layer of the invention is made, include RuCu, RuPd, RuAu or the like.

The alloys composed mainly of In, of which the anti-oxidizing layer of the invention is made, include InPd, InAu or the like. The phrase "alloys composed mainly of" in the present disclosure means an alloy composition in such a range as not to create the Schottky barrier while having an anti-oxidizing function. Accordingly, alloys that contain large amounts of other elements as alloying components in addition to Ru or In are factored out because of losing the function that the anti-oxidizing layer 45 should have.

Such anti-oxidizing layer 45 should have a thickness of preferably 0.5 nm to 1.5 nm, and more preferably 0.8 nm to 1.2 nm. At less than 0.5 nm, the anti-oxidizing layer 45 will lose the function that it should have. Being greater than 1.5 nm is not preferable because the MR ratio and other performance of the capacity will become worse, and the read gap will tend to grow wide.

The spacer layer 40 of such arrangement should have an electroconductivity in the range of 133 to 432 (S/cm), and preferably 200 to 350 (S/cm). The electro-conductivity of the spacer layer 40 is defined as the reciprocal of the resistivity ($\Omega$·cm) of the spacer layer.

According to the process for the fabrication of a magnetoresistive effect device according to the invention, the aforesaid spacer layer 40 may be formed by forming the first nonmagnetic metal layer 41, anti-oxidizing layer 45 and semiconductor layer 42 comprising an oxide semiconductor by sputtering in order into a triple-layer structure, then oxidizing the surface of the semiconductor layer 42, and finally forming the second nonmagnetic metal layer 43 by sputtering.

In a preferable embodiment of the invention, the spacer layer 40 is formed by forming the first non-magnetic metal layer 41 comprising Cu, anti-oxidizing layer 45 and semiconductor layer 42 comprising ZnO in order by sputtering into a triple-layer structure, and then oxidizing the surface of the ZnO semiconductor layer 42, and then, heat treatment operation is performed in a vacuum, and finally forming the second nonmagnetic metal layer comprising Cu by sputtering. The oxidizing treatment of the surface of the ZnO semiconductor layer 42 eliminates oxygen deficiency, and provides the ZnO semiconductor layer 42 having a uniform composition that enables the device to have uniform performance (e.g., RA and MR ratio).

The oxidizing treatment of the surface of the semiconductor layer 22 may be carried out by natural oxidization processes, plasma oxidization processes, radical oxidization processes, and so on.

In a more preferable fabrication process embodiment of the invention, the surface of the semiconductor layer is oxidized as described above. Then, heat treatment operation is performed in a vacuum, after which the second nonmagnetic metal layer is formed by sputtering. By carrying out the heat treatment operation in a vacuum, for instance, excessive oxygen may be removed to make further improvements in the performance (e.g., RA and MR ratio) of the device. Note here that such excessive oxygen is not diffused below the semiconductor layer due to the presence of the anti-oxidizing layer; it is all discharged into a vacuum chamber.

The phrase "heat treatment operation in a vacuum" refers to operating conditions involving a degree of vacuum of $10^{-8}$ to $10^{-5}$ Pa and a treating temperature of 150 to 250° C. ordinarily in a vacuum chamber.

It is here noted that the aforesaid spacer layer is usually subjected to given heat treatment after its formation for the purpose of crystallizing the semiconductor layer thereby making its resistance low. The phrase "after formation of the semiconductor layer" encompasses both the formation of the semiconductor layer alone and the formation of the whole device. Usually, the heat treatment is applied after the formation of the whole device.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is roughly broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 5 to 30 nm.

For the layer for fixing the direction of magnetization of the fixed magnetization layer 30, it is acceptable to provide a hard magnetic layer made of a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of typically about 2 to 6 nm.

The magneto-resistive effect device 5 of the invention (CPP-GMR device 5) should have an area resistivity, AR, in the range of 0.1 to $0.3\Omega \cdot \mu m^2$, preferably 0.12 to $0.3\Omega \cdot \mu m^2$, and more preferably 0.14 to $0.28\Omega \cdot \mu m^2$. Any departure from the range of 0.1 to $0.3\Omega \cdot \mu m^2$ would render it difficult to obtain large MR ratios while holding back noises and the influences of spin torque.

The device (CPP-GMR device), for which the area resistivity AR is to be measured, is a multilayer structure of underlay layer 21, antiferromagnetic layer 22, fixed magnetization layer 30, spacer layer 40, free layer 50 and protective layer 26, as shown in FIG. 1.

Further, the insulating layer 4 shown in FIG. 1, for instance, is made of alumina. For the bias magnetic field-applying layer 6, for instance, use is made of a hard magnetic layer (hard magnet), and a multilayer structure of a ferromagnetic layer and antiferromagnetic layer. More specifically, use is made of CoPt and CoCrPt.

The giant magneto-resistive effect device of the CPP structure (CPP-GMR device) in the aforesaid embodiments, for instance, may be formed by vacuum film-formation techniques such as sputtering. Optionally or if necessary, heat treatment may be applied to the device after its formation.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3 \cdot TiC$). That insulating layer has a thickness of about 0.5 to 20 μm as an example.

Then, a lower shield layer 3 comprising a magnetic material and adapted for a reproducing head is formed on that insulating layer 2. The shield layer 3 has a thickness of about 0.1 to 5 μm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing CPP-GMR device 5 is formed on the lower shield layer 3.

Although not shown, an insulating film is then formed in such a way as to cover two sides of the CPP-GMR device and the upper surface of the first shield layer 3. The insulating film is formed of an insulating material such as alumina.

Then, two bias magnetic field-applying layers 6 are formed in such a way as to be adjacent to the two sides of the CPP-GMR device 5 via the insulating layer. Then, an insulating film 7 is formed in such a way as to be located around the CPP-GMR device 5 and bias magnetic field-applying layers 6. The insulating film 7 is formed of an insulating material such as alumina.

Then, a second shield layer 8 for the reproducing head, comprising a magnetic material, is formed on the CPP-GMR device 5, bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The magnetic head comprises the lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin-film coils 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. Note here that the "throat height" means a length (height) from the medium opposite plane 20 to a position at which the two magnetic pole layers start being spaced away.

(Explanation of How the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers 3 and 8, i.e., the two electrode layers 3 and 8 at the time when a sense current is passed through the CPP-GMR device 5. It is thus possible for the reproducing head to play back the information recorded in the recording medium.

(Explanation of the Head Gimbal Assembly and the Hard Disk System)

The head gimbal assembly and the hard disk system according to the embodiment here are now explained.

A slider 210 included in the head gimbal assembly is first explained with reference to FIG. 4. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 4, it causes an air flow passing between the hard disk and the slider 210 to induce lift relative to the slider 210 in the downward y-direction in FIG. 4. This lift in turn causes the slider 210 to levitate over the surface of the hard disk. Note here that the x-direction in FIG. 4 traverses tracks on the hard disk.

Near the end of the slider 210 on an air exit side (the left lower end in FIG. 4), there is the thin-film magnetic head 100 formed according to the invention.

A head gimbal assembly 220 according to this embodiment is now explained with reference to FIG. 5. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 5 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the hard disk system according to the instant embodiment are now explained with reference to FIGS. 6 and 7.

FIG. 6 is illustrative of part of the hard disk system, and FIG. 7 is a plan view of the hard disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXAMPLES

The invention concerning the CPP-GMR device as described above is now explained in more details with reference to the following specific examples.

Experimental Example I

A CPP-GMR device sample for the invention, comprising such multilayer structure as set out in Table 1 given below, was prepared.

TABLE 1

| Multilayer Structure | | Layer Materials | Thickness (nm) |
|---|---|---|---|
| Protective Layer | | Ru | 2.0 |
| Free Layer | | $Co_{70}Fe_{30}$ | 4.0 |
| Spacer Layer | $2^{nd}$ Nonmagnetic Metal Layer | Cu | 0.7 |
| | Semiconductor Layer | ZnO | 1.2 |
| | Anti-Oxidizing Layer | Ru | 0.5 |
| | $1^{st}$ Nonmagnetic Metal Layer | Cu | 0.5 |
| Fixed Magnetization Layer | Inner Layer | $Co_{70}Fe_{30}$ | 3.5 |
| | Nonmagnetic Intermediate Layer | Ru | 0.7 |
| | Outer Layer | $Co_{70}Fe_{30}$ | 3.0 |
| Antiferromagnetic Layer | | IrMn | 5.0 |
| Underlay Layer | | NiCr | 4.0 |

(Device Sample 1 for the Invention)

In the preparation of the spacer layer, the first nonmagnetic metal layer Cu was formed by sputtering on a fixed magnetization layer at a thickness of 0.5 nm, then an Ru anti-oxidizing layer was formed by sputtering at a thickness of 0.5 nm, and then a ZnO layer that was a semiconductor layer was formed at a thickness of 1.2 nm. The ZnO layer here was formed by sputtering using a ZnO target, because Zn could not be sputtered by itself. The ZnO target cleared of oxygen deficiency as much as possible was used.

Then, for the purpose of ridding the semiconductor layer or ZnO layer of oxygen deficiency outright, the surface of ZnO was oxidized by a plasma oxidizing process under specific conditions involving a power of 25 W, an $O_2$ flow rate of 0.5 sccm and an oxidizing time of 30 seconds.

After that oxidizing treatment, the second non-magnetic metal layer Cu was formed by sputtering at a thickness of 0.7 nm.

Subsequently, the free layer and protective layer were formed to prepare device sample 1 for the invention that comprised such multilayer structure as set out in Table 1.

(Device Sample 2 for the Invention)

In the preparation of the spacer layer, the first nonmagnetic metal layer Cu was formed by sputtering on a fixed magnetization layer at a thickness of 0.5 nm, then an Ru anti-oxidizing layer was formed by sputtering at a thickness of 0.5 nm, and then a ZnO layer that was a semiconductor layer was formed at a thickness of 1.2 nm. The ZnO layer here was formed by sputtering using a ZnO target, because Zn could not be sputtered by itself. The ZnO target cleared of oxygen deficiency as much as possible was used.

Then, for the purpose of ridding the semiconductor layer or ZnO layer of oxygen deficiency outright, the surface of ZnO was oxidized by a plasma oxidizing process under specific conditions involving a power of 25 W, an $O_2$ flow rate of 0.5 sccm and an oxidizing time of 30 seconds.

After that oxidizing treatment, the assembly was heat treated in a vacuum for the purpose of removal of excessive oxygen from the ZnO layer, using a heater located on the back surface of the substrate under specific conditions involving a degree of vacuum of $10^{-6}$ Pa, a temperature of 200° C. and a treating time of 20 minutes.

After that heat treatment operation, the second non-magnetic metal layer Cu was formed by sputtering at a thickness of 0.7 nm.

Subsequently, the free layer and protective layer were formed to prepare device sample 2 for the invention that comprised such multilayer structure as set out in Table 1.

(Comparative Device Sample 1)

In the aforesaid device sample 1 for the invention, there was none of the anti-oxidizing layer forming a part of the spacer layer provided (the anti-oxidizing layer referred to in Table 1 was not provided), nor was the formed ZnO semiconductor layer oxidized. Under otherwise the same conditions as in the device sample 1 for the invention, comparative device sample 1 was prepared.

That is to say, in the preparation of the spacer layer, the first nonmagnetic metal layer Cu was formed by sputtering on a fixed magnetization layer at a thickness of 0.5 nm, then a ZnO layer that was a semiconductor layer was formed at a thickness of 1.2 nm, and then the second nonmagnetic metal layer Cu was formed by sputtering on the ZnO layer at a thickness of 0.7 nm. The ZnO layer here was formed by sputtering using a ZnO target, because Zn could not be sputtered by itself. The ZnO target cleared of oxygen deficiency as much as possible was used.

(Comparative Device Sample 2)

In the aforesaid device sample 1 for the invention, there was none of the anti-oxidizing layer forming a part of the spacer layer provided (the anti-oxidizing layer referred to in Table 1 was not provided). Under otherwise the same conditions as in the device sample 1 for the invention, comparative device sample 2 was prepared.

That is to say, in the preparation of the spacer layer, the first nonmagnetic metal layer Cu was formed by sputtering on a fixed magnetization layer at a thickness of 0.5 nm, and then a ZnO layer that was a semiconductor layer was formed at a thickness of 1.2 nm. The ZnO layer here was formed by sputtering using a ZnO target, because Zn could not be sputtered by itself. The ZnO target cleared of oxygen deficiency as much as possible was used.

Then, for the purpose of ridding the semiconductor layer or ZnO layer of oxygen deficiency, the surface of ZnO was oxidized by a plasma oxidizing process under specific conditions involving a power of 25 W, an $O_2$ flow rate of 0.5 sccm and an oxidizing time of 30 seconds.

After that oxidizing treatment, the second non-magnetic metal layer Cu was formed by sputtering at a thickness of 0.7 nm.

Each of four such CPP-GMR device samples was measured for (1) GMR change rate, and (2) the area resistivity, AR ($\Omega \cdot \mu m^2$), of the device in the following ways.

(1) GMR Change Rate (%)

The GMR change rate was measured by an ordinary dc four-terminal method. The GMR change rate (%) is indicated in terms of the value ($\Delta R/R$) found by dividing a resistance change $\Delta R$ by a resistance value R.

Note here that one hundred samples were used.

(2) Area Resistivity $\Delta R$ ($\Omega \cdot \mu m^2$) of the Device

The device was measured by a dc four-terminal method to find the resistance value per unit area. One hundred samples were used.

FIGS. 8 to 11 are graphs with GMR change rate (%) vs. device's area resistivity AR ($\Omega \cdot \mu m^2$) plotted.

Figure 8:
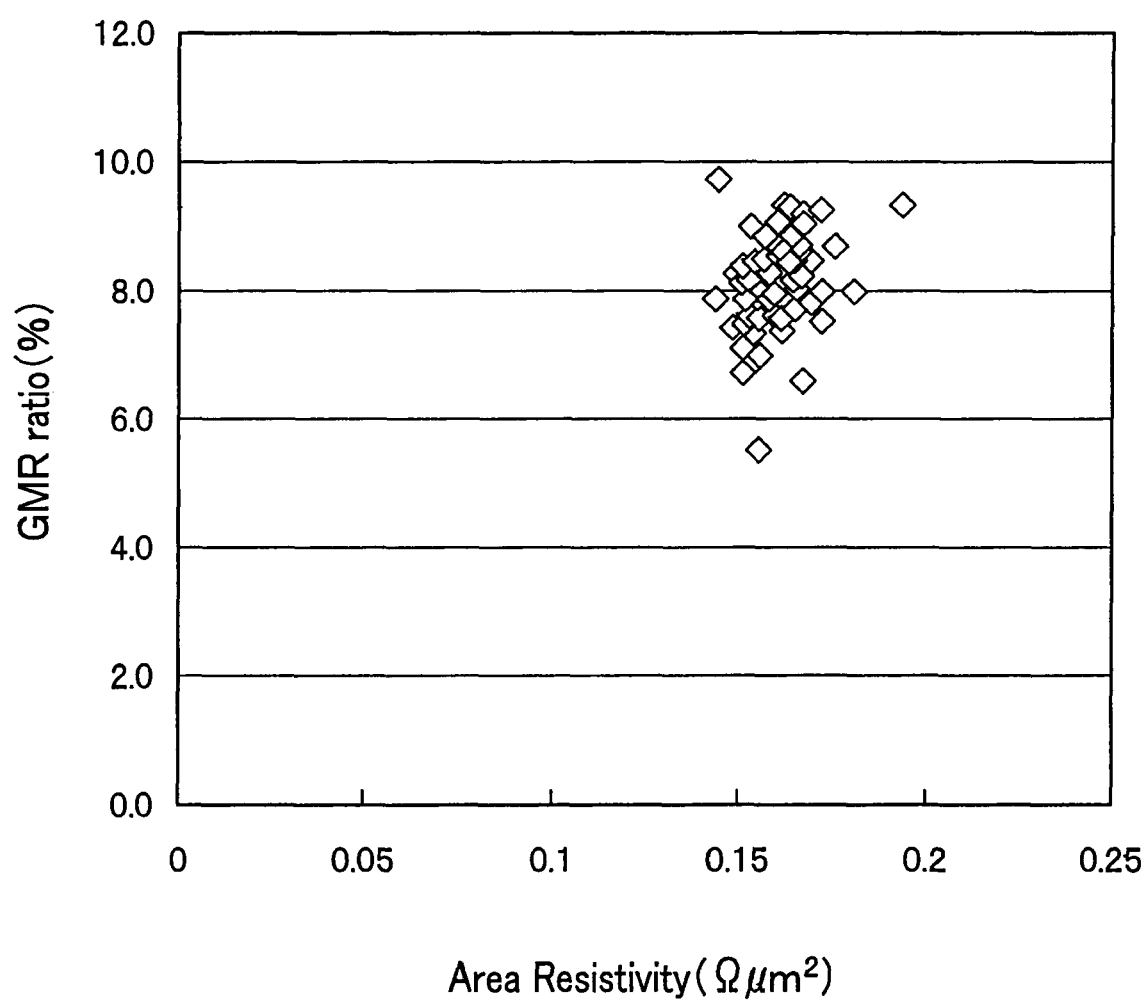
FIG. 8 is a graph plotting a group of data about GMR change rate (%) vs. device's area resistivity AR ($\Omega \cdot \mu m^2$) of device sample 1 for the invention.
Figure 9:
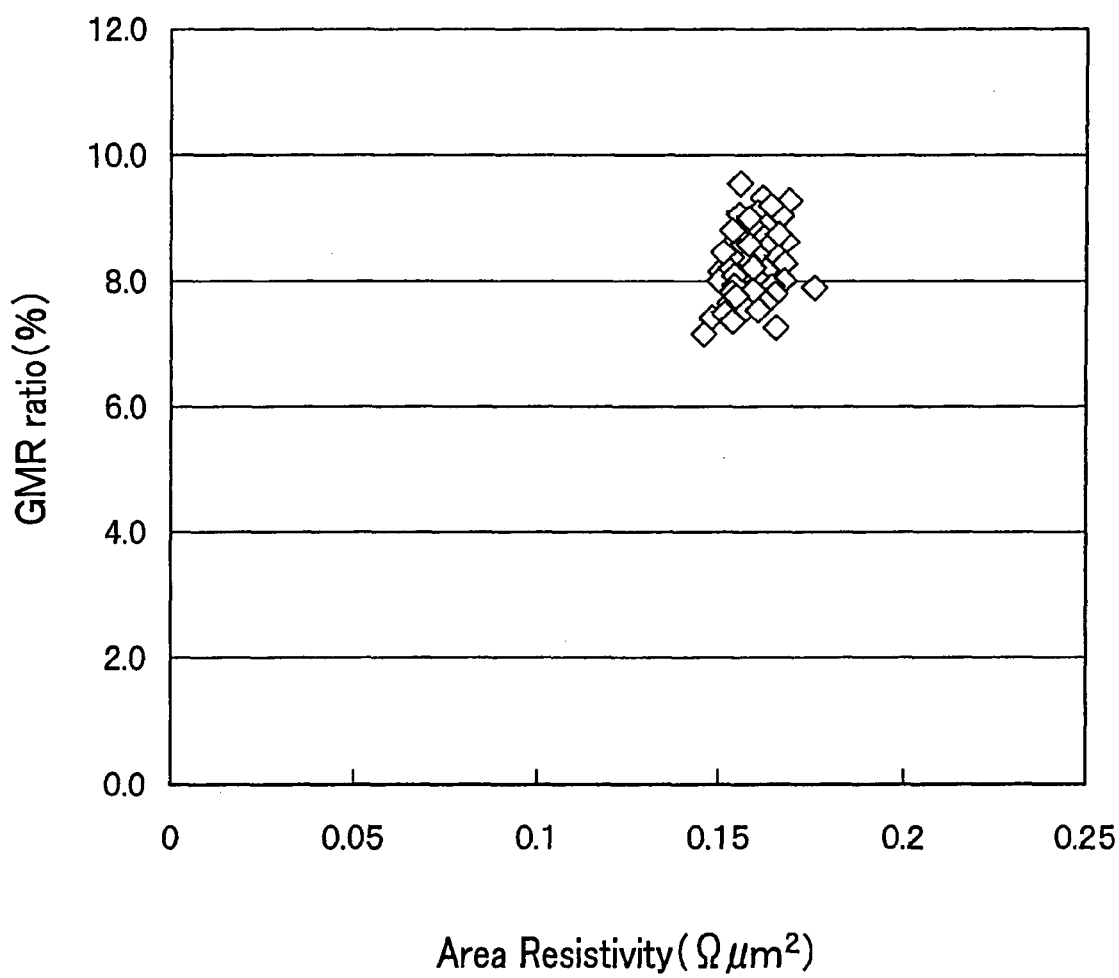
FIG. 9 is a graph plotting a group of data about GMR change rate (%) vs. device's area resistivity ($\Omega \cdot \mu m^2$) of device sample 2 for the invention.
Figure 10:
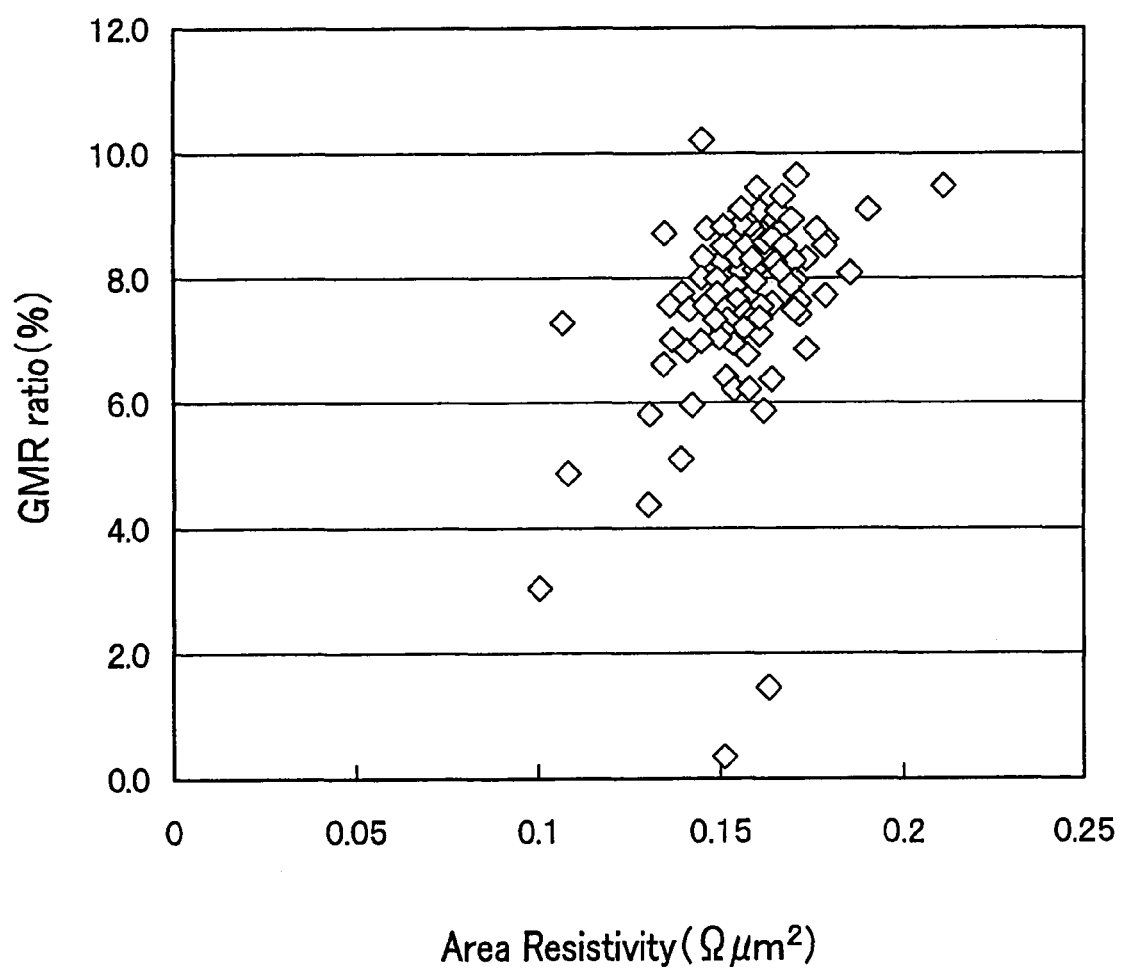
FIG. 10 is a graph plotting a group of data about GMR change rate (%) vs. device's area resistivity AR ($\Omega \cdot \mu m^2$) of device sample 1 for comparison.
Figure 11:
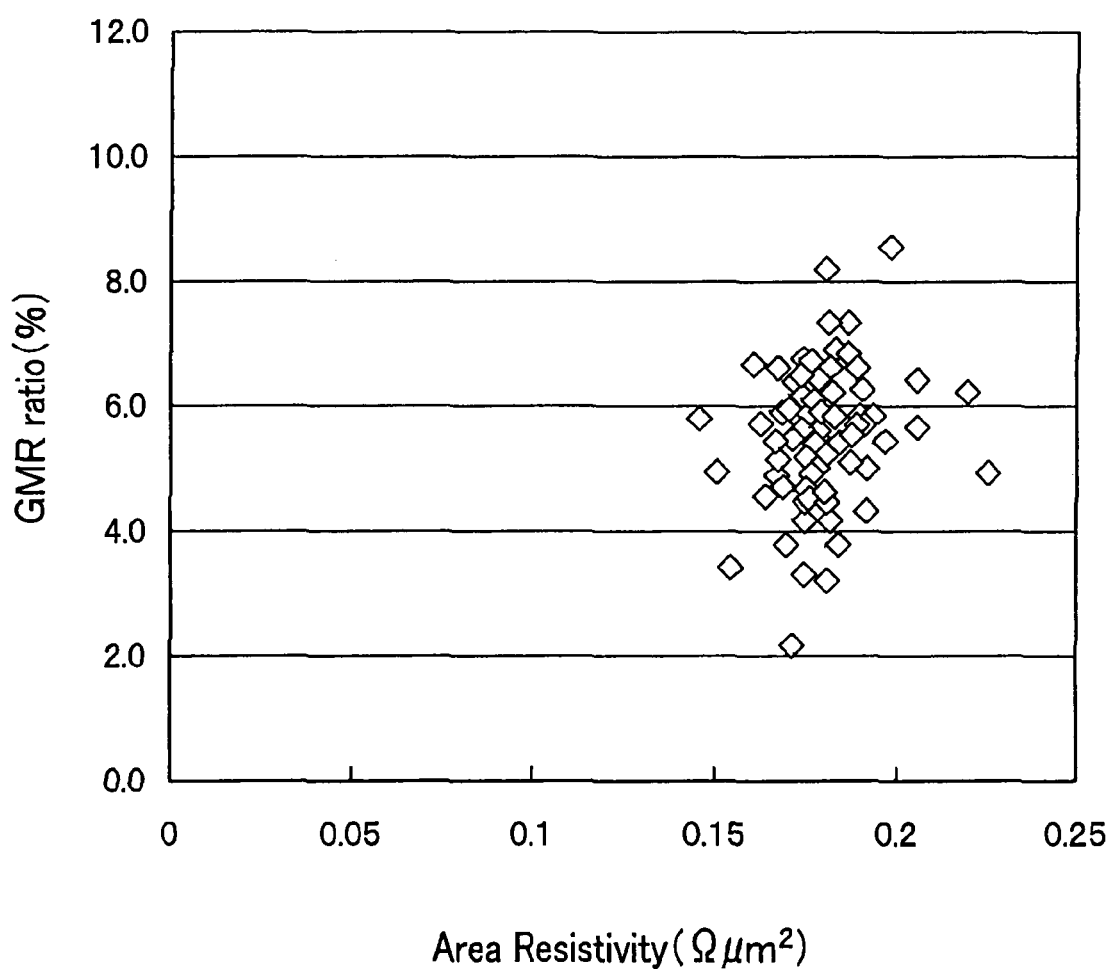
FIG. 11 is a graph plotting a group of data about GMR change rate (%) vs. device's area resistivity AR ($\Omega \cdot \mu m^2$) of device sample 2 for comparison.

FIG. 8 is indicative of a group of data about device sample 1 for the invention (one hundred samples); FIG. 9 is indicative of a group of data about device sample 2 for the invention (one hundred samples); FIG. 10 is indicative of a group of data about comparative device sample 1 (one hundred samples); and FIG. 11 is indicative of a group of data about comparative device sample 2 (one hundred samples).

From the results of FIG. 8, it is seen that by use of the anti-oxidizing film, the ZnO layer can be properly oxidized with reductions in area resistivity AR ($\Omega \cdot \mu m^2$) variations. In this case, the value of RA$\sigma$ indicative of the degree of variation of the device's resistance was 0.012.

From the results of FIG. 9, it is further appreciated that by use of the anti-oxidizing film, the ZnO layer can be properly oxidized and later heat treated, and the area resistivity AR ($\Omega \cdot \mu m^2$) variations are much more reduced. In this case, the value of RA$\sigma$ indicative of the degree of variation of the device's resistance was 0.010.

In the comparative example of FIG. 10, there is an oxygen deficient state found with the value of RA$\sigma$ indicative of the degree of variation being 0.015.

In the comparative example of FIG. 11, the GMR change rate is found to remain low, probably because of device film deterioration. In this case, the value of RA$\sigma$ indicative of the degree of variation of the device's resistance was 0.013.

Experimental Example II

Both a CPP-GMR device sample for the invention, comprising such multilayer structure as set out in Table 1 (the anti-oxidizing layer was made of Ru) and a comparative CPP-GMR device sample comprising such multilayer structure as set out in Table 2 given below (the anti-oxidizing layer was made of Au) were considered about the head noise ($\mu$Vrms/Hz), and actual head noises ($\mu$Vrms/Hz) were measured. In this experimentation, device size was 200 nm$\phi$.

TABLE 2

| Multilayer Structure | | Layer Material | Thickness (nm) |
|---|---|---|---|
| Protective Layer | | Ru | 2.0 |
| Free Layer | | $Co_{70}Fe_{30}$ | 4.0 |
| Spacer Layer | $2^{nd}$ Nonmagnetic | Cu | 0.7 |

TABLE 2-continued

|  | Multilayer Structure | Layer Material | Thickness (nm) |
|---|---|---|---|
| | Metal Layer | | |
| | Semiconductor Layer | ZnO | 1.2 |
| | Anti-Oxidizing Layer | Au | 0.5 |
| | 1$^{st}$ Nonmagnetic Metal Layer | Cu | 0.5 |
| Fixed Magnetization Layer | Inner Layer | Co$_{70}$Fe$_{30}$ | 3.5 |
| | Nonmagnetic Intermediate Layer | Ru | 0.7 |
| | Outer Layer | Co$_{70}$Fe$_{30}$ | 3.0 |
| | Antiferromagnetic Layer | IrMn | 5.0 |
| | Underlay Layer | NiCr | 4.0 |

Measurement of the Head Noise (μVrms/Hz)

This head noise was measured with a 44 mA current passed through the device and a magnetic field of 6 kOe applied to the head, and the voltage (noise) at the device was analyzed by a spectrum analyzer.

A brief account is now given of the head noise.

The head noise is broken down into two noise components: Johnson noise (Vj) that is thermal noise and shot noise (Vs) that is quantum noise.

Johnson noise (Vj) here is represented by equation (1):

$$\text{Johnson noise}(Vj) = (4K_B T \Delta f R)^{1/2} \quad (1)$$

where $K_B$ is a Boltzmann constant, T is a device temperature, $\Delta f$ is a band, and R is a resistance value.

The shot noise is represented by equation (2):

$$\text{Shot noise}(Vs) = (2eI\Delta f)^{1/2} \cdot R \quad (2)$$

where e is an electron's charge, I is a current, $\Delta f$ is a band, and R is a resistance value.

(Consideration of the Device Sample for the Invention Set Out in Table 1)

The Johnson noise (Vj) and shot noise (Vs) of the structure of the inventive device set out in Table 1 were figured out of the device's resistance value and the quantity of applied currents, respectively, using the aforesaid equations (1) and (2).

Figure 12:
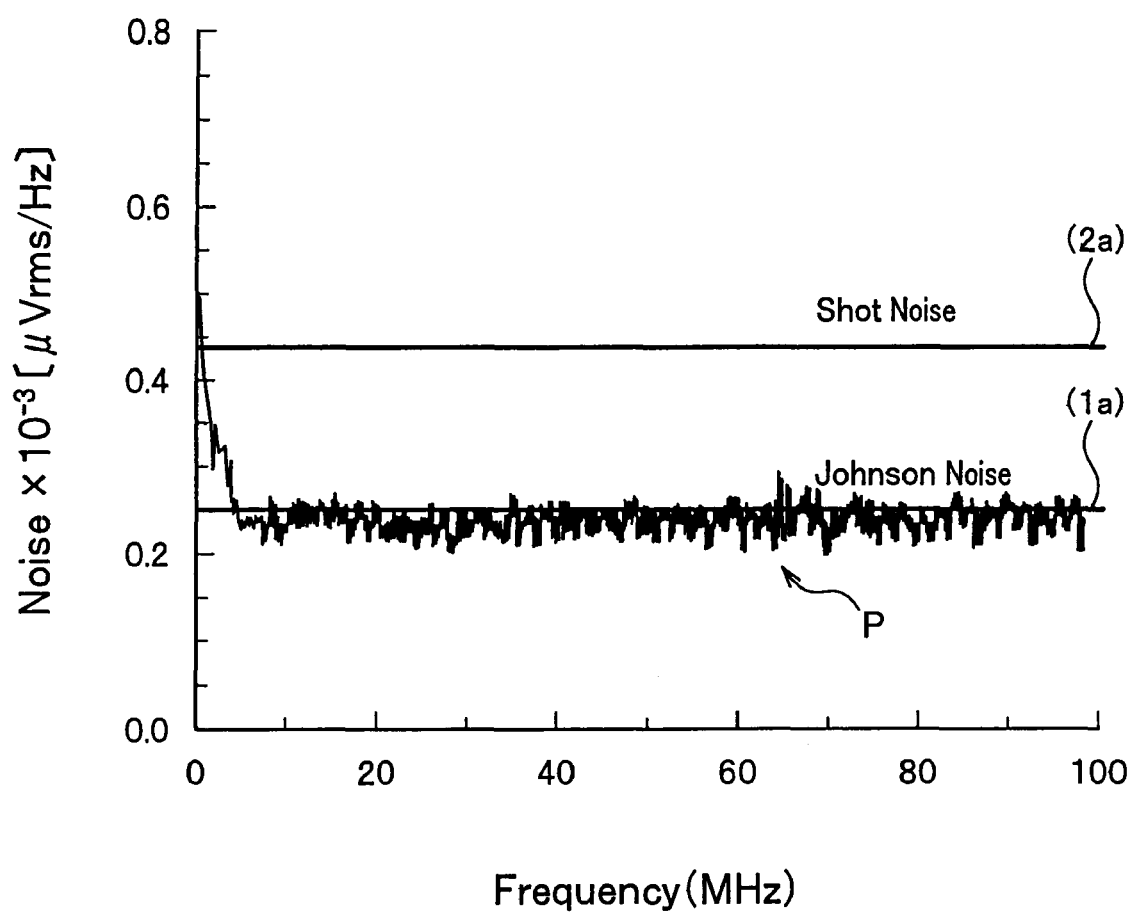
FIG. 12 is a graph indicative of head noise vs. frequency f (MHz) of the device sample for the invention.

The results are plotted in FIG. 12. In FIG. 12, line (1a) is an estimated line value for Johnson noise (Vj) figured out of the resistance value of the device, using the aforesaid equation (1). Line (2a) is an estimated line value for shot noise (Vs) figured out of the resistance value of the device, using the aforesaid equation (2). Referring to noise magnitude, the shot noise (Vs) is larger than Johnson noise (Vj).

Referring to the device sample for the invention set out in Table 1, the spectrum of an actually obtained head noise (indicated by a wave line P in FIG. 12) appears at a Johnson noise (Vj) position, as shown in FIG. 12. It follows that only Johnson noise comes out of this device sample yet with no occurrence of shot noise. Note here that the resistance of the device is 3.7Ω.

Johnson noise, because of being capable of ohmic conduction, tends to work overwhelmingly for S/N value with a head.

(Consideration of the Comparative Device Sample Set Out in Table 2)

The Johnson noise (Vj) and shot noise (Vs) of the structure of the comparative device set out in Table 2 (the anti-oxidizing layer Au) were figured out of the device's resistance value, using the aforesaid equations (1) and (2).

Figure 13:
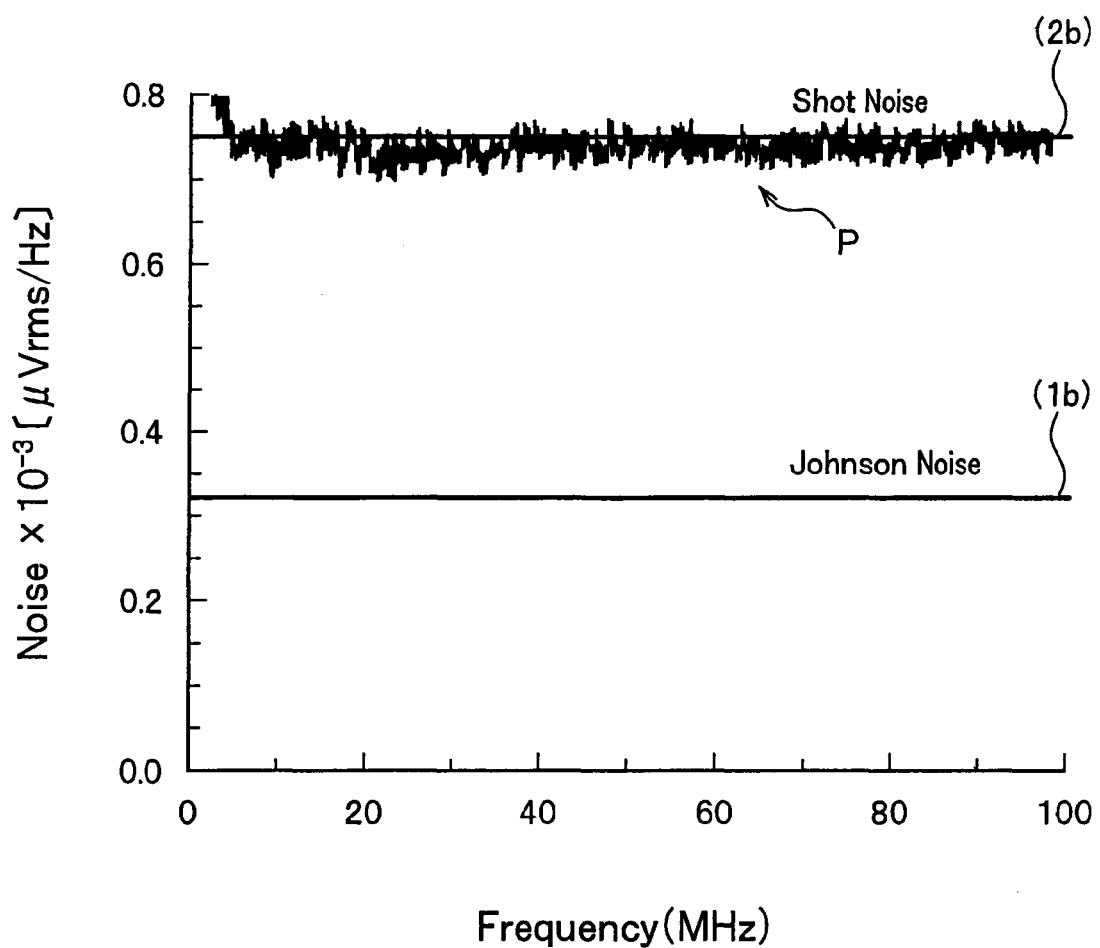
FIG. 13 is a graph indicative of head noise vs. frequency f (MHz) of the device sample for comparison.

The results are plotted in FIG. 13. In FIG. 13, line (1b) is an estimated line value for Johnson noise (Vj) figured out of the resistance value of the device, using the aforesaid equation (1). Line (2b) is an estimated line value for shot noise (Vs) figured out of the resistance value of the device, using the aforesaid equation (2). Referring to noise magnitude, the shot noise (Vs) is larger than Johnson noise (Vj).

Referring to the comparative device sample set out in Table 2, the spectrum of an actually obtained head noise (indicated by a wave line P in FIG. 13) appears at a shot noise (Vs) position, as shown in FIG. 13. It follows that only the shot noise comes out of this comparative device sample yet with no occurrence of Johnson noise. The Schottky barrier concurrently occurring at the joining interface brought the device's resistance value up to 6.4Ω.

The shot noise, because of being capable of tunnel conduction, works against S/N for the reason that the noise component will grow large even at an increasing MR ratio.

From the aforesaid results of experimentation, it is found that there is a change in the interface state between the anti-oxidizing layer and ZnO dependent on what is selected for the anti-oxidizing layer, which often gives rise to a Schottky junction. Although depending on what is selected for the semiconductor material, there is none of the Schottky junction formed even when Au is used as the anti-oxidizing agent.

The advantages of the invention would be undisputed from the aforesaid results of a series of experiments. That is to say, the invention provides a giant magneto-resistive effect device (CPP-GMR device) having a CPP (current perpendicular to plane) structure comprising a spacer layer, and a fixed magnetization layer and a free layer stacked one upon another with the spacer layer interposed between them, with a sense current applied in a stacking direction. The free layer functions such that the direction of magnetization changes depending on an external magnetic field. The spacer layer comprises a first nonmagnetic metal layer and a second nonmagnetic metal layer, each made of a nonmagnetic metal material, and a semiconductor layer formed between the first and the second nonmagnetic metal layer. The semiconductor layer is an n-type oxide semiconductor. When the first and second nonmagnetic metal layers are formed in order, the first nonmagnetic metal layer is formed prior to the second nonmagnetic metal layer, and an anti-oxidizing layer is formed between the first and the semiconductor layer. The anti-oxidizing layer is formed of a material incapable of producing a Schottky barrier upon joining to the semiconductor layer. It is thus possible to achieve very favorable advantages of obtaining high MR properties without increasing head noises, and holding back variations of device's area resistivity (AR), thereby making much more improvements in the reliability of film characteristics.

INDUSTRIAL APPLICABILITY

The invention may be applied to the field of a hard disk system comprising a magneto-resistive effect device for reading the magnetic field strength of a magnetic recording medium or the like as signals.

What we claim is:

1. A giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, characterized in that:

said free layer functions such that a direction of magnetization changes depending on an external magnetic field, and said spacer layer comprises a first nonmagnetic metal layer and a second nonmagnetic metal layer, each made of a nonmagnetic metal material, and a semiconductor layer formed between said first nonmagnetic metal layer and said second nonmagnetic metal layer, wherein:

said semiconductor layer is an n-type oxide semiconductor, when said first and second nonmagnetic metal layers are formed in order, said first nonmagnetic metal layer is formed prior to said second nonmagnetic metal layer, and an anti-oxidizing layer is formed between said first non-magnetic metal layer and said semiconductor layer, and said anti-oxidizing layer is formed of a material incapable of producing a Schottky barrier upon joining to said semiconductor layer.

2. The magneto-resistive effect device according to claim 1, wherein said anti-oxidizing layer is made of a material of which the value of a work function is smaller than that of a material of which said first nonmagnetic metal layer is made.

3. The magneto-resistive effect device according to claim 1, wherein said first nonmagnetic metal layer is made of Cu, and said anti-oxidizing layer is made of at least one selected from the group consisting of Ru, In, alloys composed mainly of Ru, and alloys composed mainly of In.

4. The magneto-resistive effect device according to claim 1, wherein said first nonmagnetic metal layer and said second nonmagnetic metal layer are each made of Cu, said semiconductor layer is made of ZnO, and said anti-oxidizing layer is made of at least one selected from the group consisting of Ru, In, alloys composed mainly of Ru, and alloys composed mainly of In.

5. The magneto-resistive effect device according to claim 1, wherein said anti-oxidizing layer has a thickness of 0.5 nm to 1.5 nm.

6. The magneto-resistive effect device according to claim 1, which has an area resistivity of 0.1 to $0.3\Omega \cdot \mu m^2$.

7. A process for fabricating a magneto-resistive effect device as recited in claim 1, characterized in that:

when said spacer layer is formed, the first non-magnetic metal layer, anti-oxidizing layer and semiconductor layer are formed by sputtering in order into a triple-layer structure, and the surface of the semiconductor layer is then oxidized, after which the second nonmagnetic metal layer is formed by sputtering.

8. A process for fabricating a magneto-resistive effect device as recited in claim 4, characterized in that:

when said spacer layer is formed, the first non-magnetic metal layer comprising Cu, anti-oxidizing layer and semiconductor layer comprising ZnO are formed by sputtering in order into a triple-layer structure, and the surface of the ZnO semiconductor layer is then oxidized, after which the second nonmagnetic metal layer comprising Cu is formed by sputtering.

9. The process for fabricating a magneto-resistive effect device according to claim 7, wherein the surface of said semiconductor layer is oxidized, and then heat treated in a vacuum, after which the second non-magnetic metal layer is formed by sputtering.

10. A thin-film magnetic head, characterized by comprising:

a plane opposite to a recoding medium, a magneto-resistive effect device as recited in claim 1, which is located near said medium opposite plane for detecting a signal magnetic field from said recording medium, and a pair of electrodes for passing a current in the stacking direction of said magneto-resistive effect device.

11. A head gimbal assembly, characterized by comprising:

a slider including a thin-film magnetic head as recited in claim 10 and located in opposition to a recording medium, and a suspension adapted to resiliently support said slider.

12. A hard disk system, characterized by comprising:

a slider including a thin-film magnetic head as recited in claim 10 and located in opposition to a recording medium, and a positioning means adapted to support and position said slider with respect to said recording medium.

* * * * *